United States Patent
Tsujikawa

(10) Patent No.: US 10,095,124 B2
(45) Date of Patent: Oct. 9, 2018

(54) DETECTION APPARATUS, LITHOGRAPHY APPARATUS, METHOD OF MANUFACTURING ARTICLE, AND DETECTION METHOD

(71) Applicant: CANON KABUSHIKI KAISHA, Tokyo (JP)

(72) Inventor: Takuro Tsujikawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 17 days.

(21) Appl. No.: 15/189,043

(22) Filed: Jun. 22, 2016

(65) Prior Publication Data
US 2017/0005017 A1 Jan. 5, 2017

(30) Foreign Application Priority Data

Jul. 2, 2015 (JP) .................................. 2015-133920

(51) Int. Cl.
*G03F 7/20* (2006.01)
*G06T 7/00* (2017.01)

(52) U.S. Cl.
CPC ...... *G03F 7/70775* (2013.01); *G03F 7/70683* (2013.01); *G06T 7/0004* (2013.01); *G06T 2207/30148* (2013.01); *G06T 2207/30204* (2013.01)

(58) Field of Classification Search
CPC .............................. G03F 9/7046; G03F 9/7088
See application file for complete search history.

(56) References Cited

U.S. PATENT DOCUMENTS

| 5,028,797 | A | * | 7/1991 | Abe | G03F 9/7049 250/548 |
|---|---|---|---|---|---|
| 6,151,121 | A | * | 11/2000 | Mishima | G03F 9/7065 356/399 |
| 2003/0053058 | A1 | * | 3/2003 | Tanaka | G03F 9/7003 356/401 |
| 2003/0053059 | A1 | * | 3/2003 | Mishima | G03F 9/7046 356/401 |
| 2003/0054574 | A1 | * | 3/2003 | Tanaka | G03F 9/7003 438/4 |
| 2003/0235330 | A1 | * | 12/2003 | Tanaka | G03F 9/7084 382/151 |

(Continued)

FOREIGN PATENT DOCUMENTS

JP        2004219479 A        8/2004

*Primary Examiner* — Steven H Whitesell Gordon
(74) *Attorney, Agent, or Firm* — Rossi, Kimms & McDowell LLP

(57) ABSTRACT

The present invention provides a detection apparatus which detects a position of a mark on a substrate, the apparatus comprising an image capturing unit having an image sensor configured to capture an image of the mark, and a processor configured to control the image capturing unit such that second image capturing is performed after first image capturing is performed, and determine the position of the mark based on an image obtained by the second image capturing, wherein the processor controls the first image capturing such that an accumulation period of charges in the image sensor becomes shorter than that in the second image capturing, and determines an image capturing condition of the second image capturing based on an output of the image sensor in the first image capturing.

12 Claims, 8 Drawing Sheets

(56) References Cited

U.S. PATENT DOCUMENTS

| | | | |
|---|---|---|---|
| 2004/0189995 A1* | 9/2004 | Tanaka | G03F 9/7003 356/401 |
| 2008/0013073 A1* | 1/2008 | Kobayashi | G03F 9/7003 356/73 |
| 2009/0296058 A1* | 12/2009 | Slotboom | G03F 7/70516 355/53 |
| 2010/0271609 A1* | 10/2010 | Tsujikawa | G01B 11/03 355/67 |
| 2013/0148091 A1* | 6/2013 | Sentoku | G03F 7/70141 355/67 |

* cited by examiner

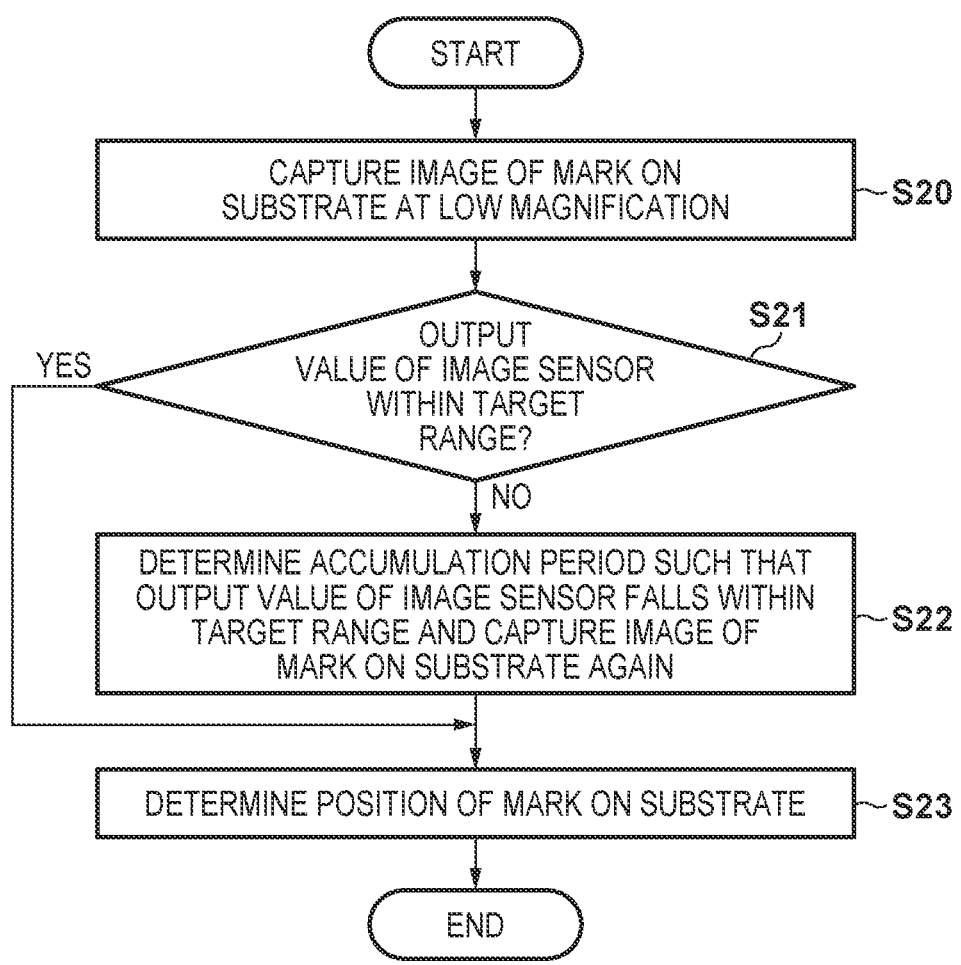

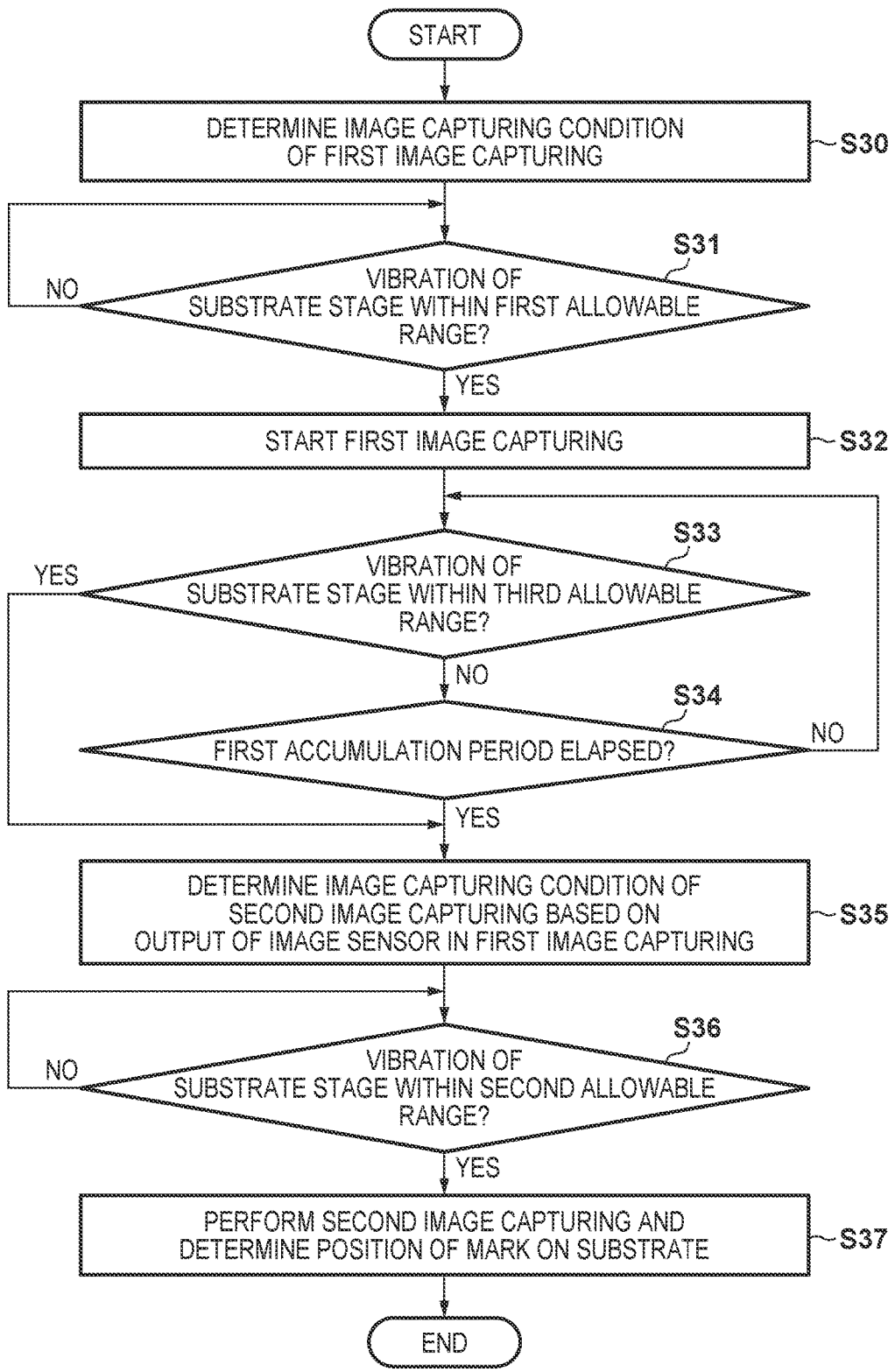

DETECTION APPARATUS, LITHOGRAPHY APPARATUS, METHOD OF MANUFACTURING ARTICLE, AND DETECTION METHOD

BACKGROUND OF THE INVENTION

Field of the Invention

The present invention relates to a detection apparatus which detects the position of a mark on a substrate, a lithography apparatus using it, a method of manufacturing an article, and a detection method.

Description of the Related Art

In a lithography apparatus, a detection unit (detection apparatus) which detects the position of a mark on a substrate is provided and the substrate is positioned based on a result of detection by the detection unit. For example, the detection unit includes an image sensor which captures an image of the mark on the substrate and detects the position of the mark using the image obtained by the image sensor. However, the mark on the substrate can have a different state (such as the reflectance of light, the shape, or the like) among, for example, a plurality of substrates (lots). Accordingly, the output value of the image sensor falls outside a target range depending on the state of the mark, making it difficult to detect the position of the mark accurately.

Japanese Patent Laid-Open No. 2004-219479 proposes a method of performing, before image capturing (actual image capturing) for detecting a position of a mark on a substrate, image capturing (photometry) for determining an image capturing condition of the actual image capturing. In Japanese Patent Laid-Open No. 2004-219479, photometric operations are performed a plurality of times on the different image capturing conditions of an image sensor, and the image capturing condition on which a photometric value falls within the effective dynamic range of the image sensor is determined as the image capturing condition in the actual image capturing.

In the method described in Japanese Patent Laid-Open No. 2004-219479, a time for performing each of the plurality of photometric operations is not defined. Thus, it may take a considerable time to perform the plurality of photometric operations. In this case, the start of the actual image capturing may be delayed from a desired timing, decreasing throughput.

SUMMARY OF THE INVENTION

The present invention provides a technique advantageous in, for example, detecting a mark on a substrate accurately while suppressing a decrease in throughput.

According to one aspect of the present invention, there is provided a detection apparatus which detects a position of a mark on a substrate, the apparatus comprising: an image capturing unit having an image sensor configured to capture an image of the mark; and a processor configured to control the image capturing unit such that second image capturing is performed after first image capturing is performed, and determine the position of the mark based on an image obtained by the second image capturing, wherein the processor controls the first image capturing such that an accumulation period of charges in the image sensor becomes shorter than that in the second image capturing, and determines an image capturing condition of the second image capturing based on an output of the image sensor in the first image capturing.

Further features of the present invention will become apparent from the following description of exemplary embodiments with reference to the attached drawings.

BRIEF DESCRIPTION OF THE DRAWINGS

FIG. 7 is a flowchart showing a process of capturing images of the marks on the substrate by an image capturing unit at a low magnification; and FIG. 8 is a flowchart showing a process of capturing the images of the marks on the substrate by the image capturing unit at a high magnification.

DESCRIPTION OF THE EMBODIMENTS

Figure 1:
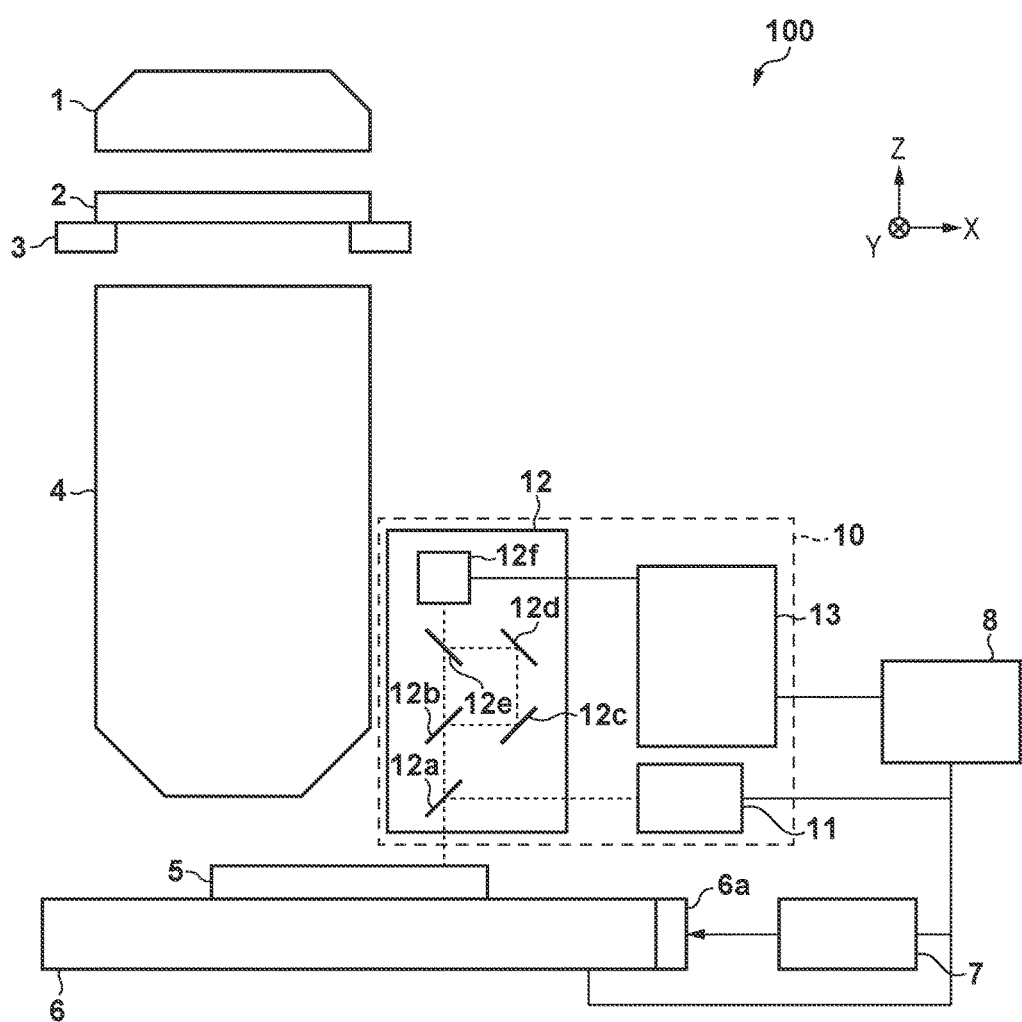
FIG. 1 is a schematic view showing an exposure apparatus according to the first embodiment.

Exemplary embodiments of the present invention will be described below with reference to the accompanying drawings. Note that the same reference numerals denote the same members throughout the drawings, and a repetitive description thereof will not be given. In embodiments below, an example will be described in which the present invention is applied to an exposure apparatus which exposes a substrate. However, the present invention can also be applied to a lithography apparatus such as art imprint apparatus or a drawing apparatus.

First Embodiment

An exposure apparatus 100 according to the first embodiment of the present invention will be described with reference to FIG. 1. FIG. 1 is a schematic view showing the exposure apparatus 100 of the first embodiment. The exposure apparatus 100 can include, for example, an illumination optical system 1, a mask stage 3 that can move while holding a mask 2, a projection optical system 4, a substrate stage 6 that can move while holding a substrate 5, a detection unit 10 (detection apparatus), and a controller 8. The controller 8 includes, for example, a CPU and a memory and controls a process of forming a pattern on the substrate 5 (a process of transferring a pattern formed on the mask 2 onto the substrate 5). The controller 8 controls, based on the position of each mark 5a on the substrate detected by the detection unit 10, the position of the substrate stage 6 when the pattern is formed on the substrate 5.

The illumination optical system 1 illuminates the mask 2 held by the mask stage 3 using light emitted from a light source (not shown). The projection optical system 4 has a predetermined magnification and projects, on the substrate 5, the pattern formed on the mask 2. The mask 2 and the substrate 5 are held by the mask stage 3 and the substrate stage 6, respectively, and arranged at almost optically conjugate positions (the object plane and Imaging plane of the projection optical system 4) via the projection optical system 4.

The substrate stage 6 holds the substrate 5 by a vacuum suction force or an electrostatic force and is configured to be movable, for example, in the X and Y directions. A measurement unit 7 measures the position of the substrate stage 6. The measurement unit 7 includes, for example, an interferometer, irradiates a reflecting plate 6a provided on the substrate stage 6 with light, and obtains a displacement from the reference position of the substrate stage 6 based on the light reflected by the reflecting plate 6a. This allows the measurement unit 7 to measure the position of the substrate stage 6.

The detection unit 10 includes a light source 11, an image capturing unit 12 (scope), and a processor 13, and detects the position of each mark on the substrate. The image capturing unit 12 includes beam splitters 12a and 12e, a plurality of mirrors 12b to 12d, and an image sensor 12f, and is configured to capture images of the marks 5a on the substrate at a plurality of different magnifications (a low magnification and a high magnification). For example, the mirror 12b is inserted onto an optical path when the image of each mark 5a on the substrate is captured at the high magnification and the mirror 12b is removed from the optical path when the image of each mark 5a on the substrate is captured at the low magnification. The processor 13 determines the position of each mark 5a on the substrate based on an image obtained by capturing, using the image capturing unit 12 (image sensor 12f), the image of the mark 5a. In FIG. 1, the processor 13 and the controller 8 are arranged separately. However, they may be arranged integrally. Note that a half mirror, a polarizing beam splitter, or the like can be used as the beam splitter 12a. A CCD sensor, a CMOS sensor, or the like can be used as the image sensor 12f.

Figure 2:
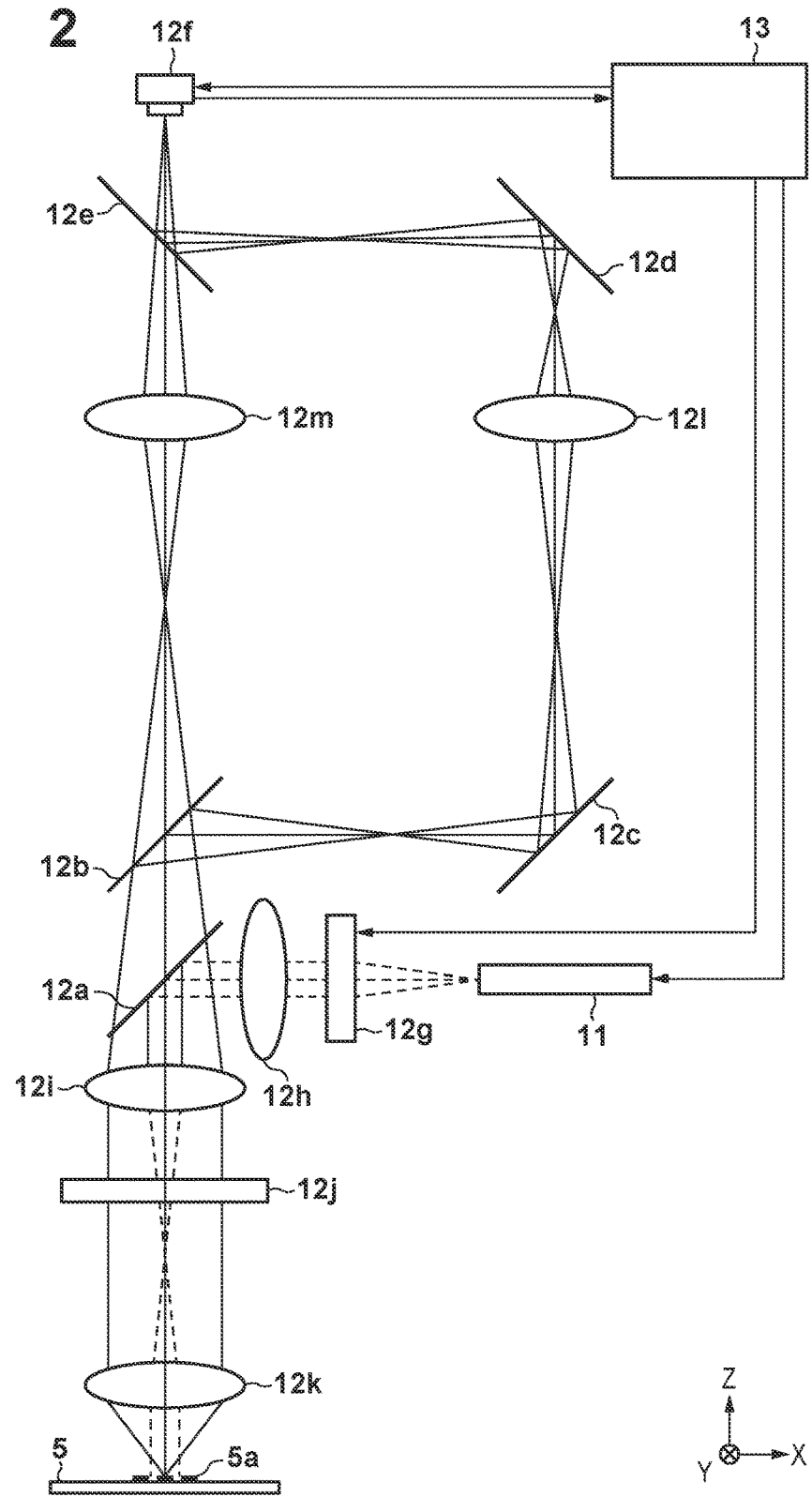
FIG. 2 is a view showing the arrangement of a detection unit.

A detailed arrangement of the detection unit 10 will now be described with reference to FIG. 2. FIG. 2 is a view showing the arrangement of the detection unit 10. In the detection unit 10 shown in FIG. 2, the polarizing beam splitter can be used as the beam splitter 12a and the half mirror can be used as the beam splitter 12a.

Light emitted from the light source 11 is incident on the beam splitter 12a (polarizing beam splitter) after passing through a variable ND filter 12g and an optical system 12h. The light reflected by the beam splitter 12a is incident on the marks 5a on the substrate via a relay lens 12i, a λ/4 waveplate 12j, and an objective lens 12k. Then, the light reflected by the marks 5a on the substrate passes through the beam splitter 12a after passing through the objective lens 12k, the λ/4 waveplate 12j, and the relay lens 12i again.

Figure 3A:
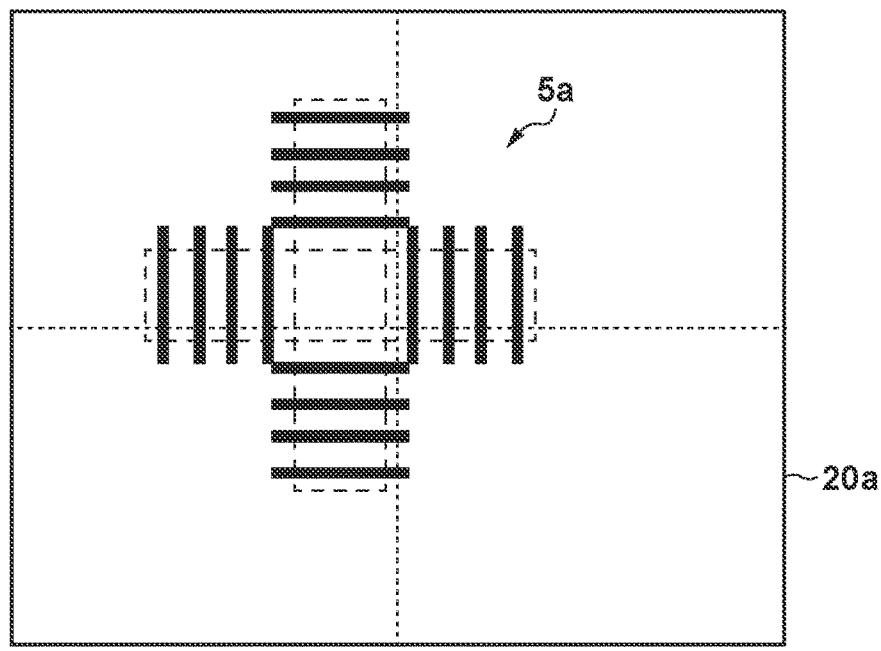
FIG. 3A is a view showing an image (at a high magnification) obtained by image capturing in an image sensor.

When the image of each mark 5a on the substrate is captured at the high magnification, the mirror 12b is inserted onto the optical path. In this case, the light that has been transmitted through the beam splitter 12a is reflected by the mirrors 12b and 12c, and is incident on a high-magnification imaging optical system 12l. Then, the light that has passed through the imaging optical system 12l is reflected by the mirror 12d and incident on the beam splitter 12e (half mirror). The light reflected by the beam splitter 12e is incident on the image sensor 12f. This allows the image sensor 12f to capture the image of each mark 5a on the substrate at the high magnification. FIG. 3A is a view showing an image 20a obtained by capturing, using the image sensor 12f, the image of the mark 5a on the substrate at the high magnification.

Figure 3B:
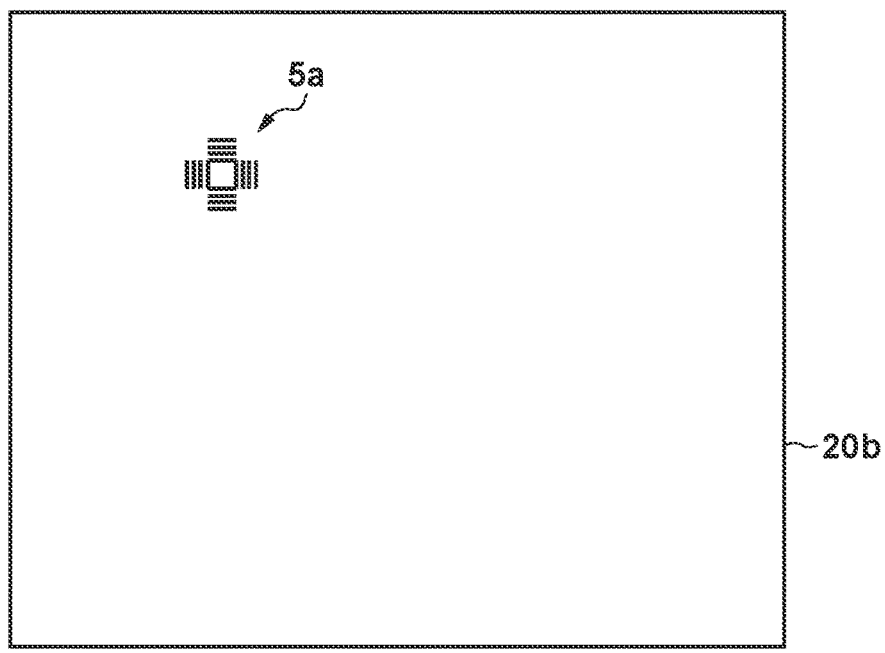
FIG. 3B is a view showing an image (at a low magnification) obtained by image capturing in the image sensor.

On the other hand, when the image of the mark 5a on the substrate is captured at the low magnification, the mirror 12b is removed from the optical path. In this case, the light that has been transmitted through the beam splitter 12a (polarising beam splitter) is incident on a low-magnification imaging optical system 12m. Then, the light, out of the light that has passed through the imaging optical system 12m, that has been transmitted through the beam splitter 12e (half mirror) is incident on the image sensor 12f. This allows the image sensor 12f to capture the image of each mark 5a on the substrate at the low magnification. FIG. 3B is a view showing an image 20b obtained by capturing, using the image sensor 12f, the image of the mark 5a on the substrate at the low magnification.

Figure 4:
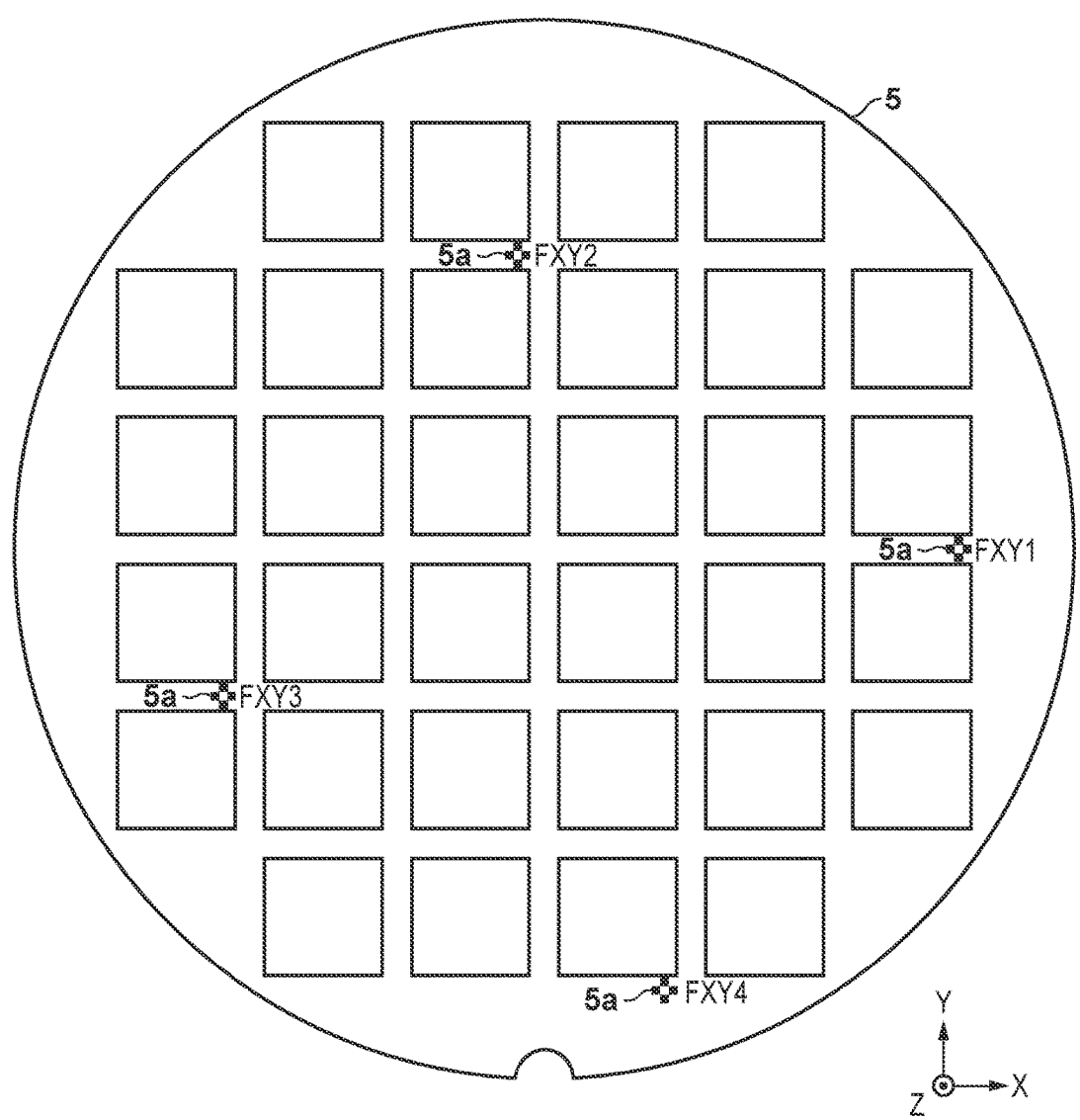
FIG. 4 is a view showing an example of the arrangement of a plurality of marks on a substrate.

A method of detecting the positions of the plurality of marks 5a formed on the substrate as shown in FIG. 4 will now be described with reference to FIG. 5. FIG. 4 is a view showing an example of the arrangement of the plurality of marks 5a on the substrate. In FIG. 4, four marks 5a are arranged on the substrate and the respective marks 5a are denoted by FXY1 to FXY4. Each mark 5a on the substrate can be formed by, for example, eight line elements (X1 to X8) aligned in the X direction and eight line elements (Y1 to Y8) aligned in the Y direction, as shown in FIG. 6. The eight line elements (X1 to X8) aligned in the X direction can be used to detect the position of the mark in the X direction. The eight line elements (Y1 to Y8) aligned in the Y direction can be used to detect the position of the mark in the Y direction.

Figure 5:
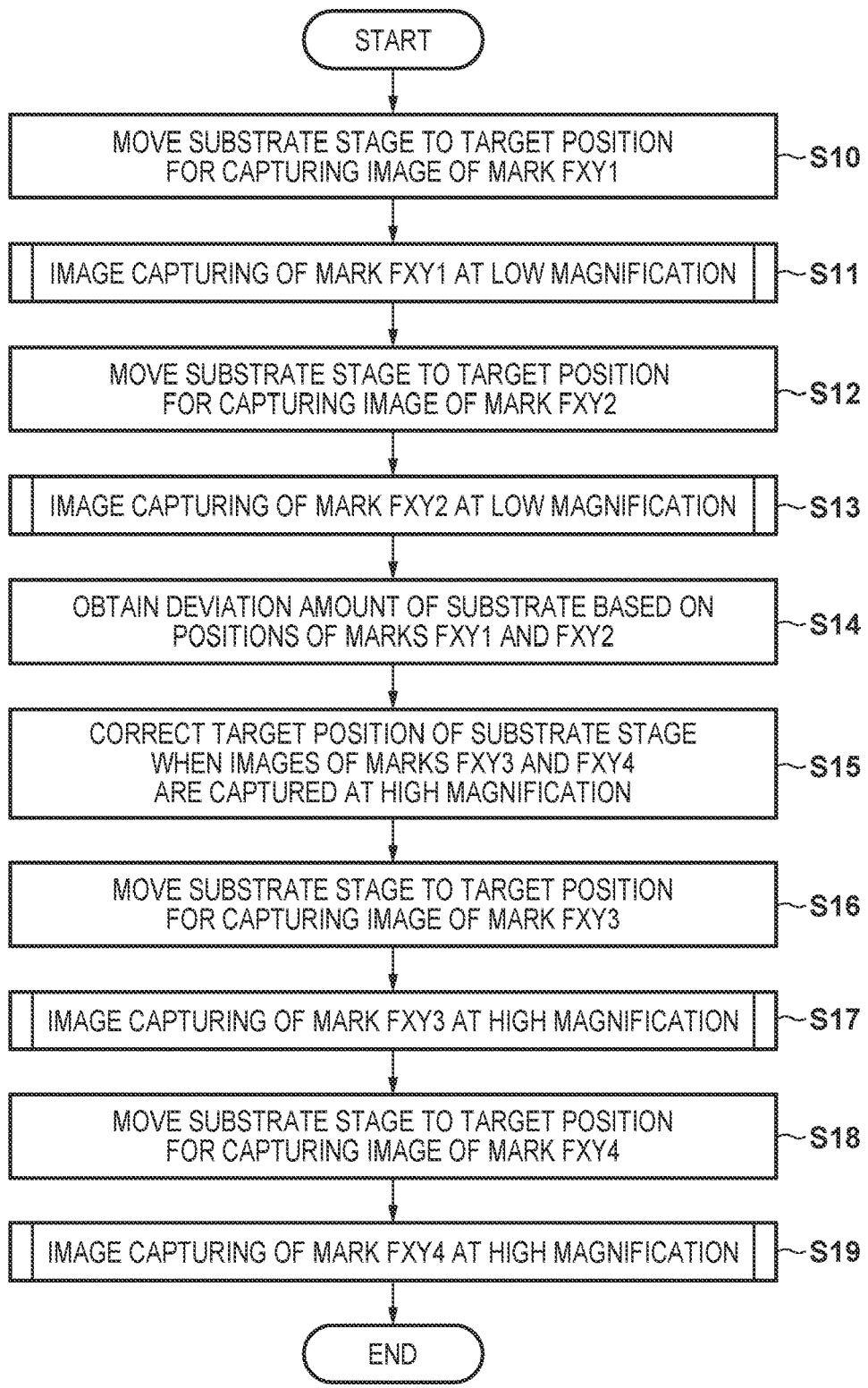
FIG. 5 is a flowchart showing a method of detecting the positions of the plurality of marks formed on the substrate.
Figure 6:
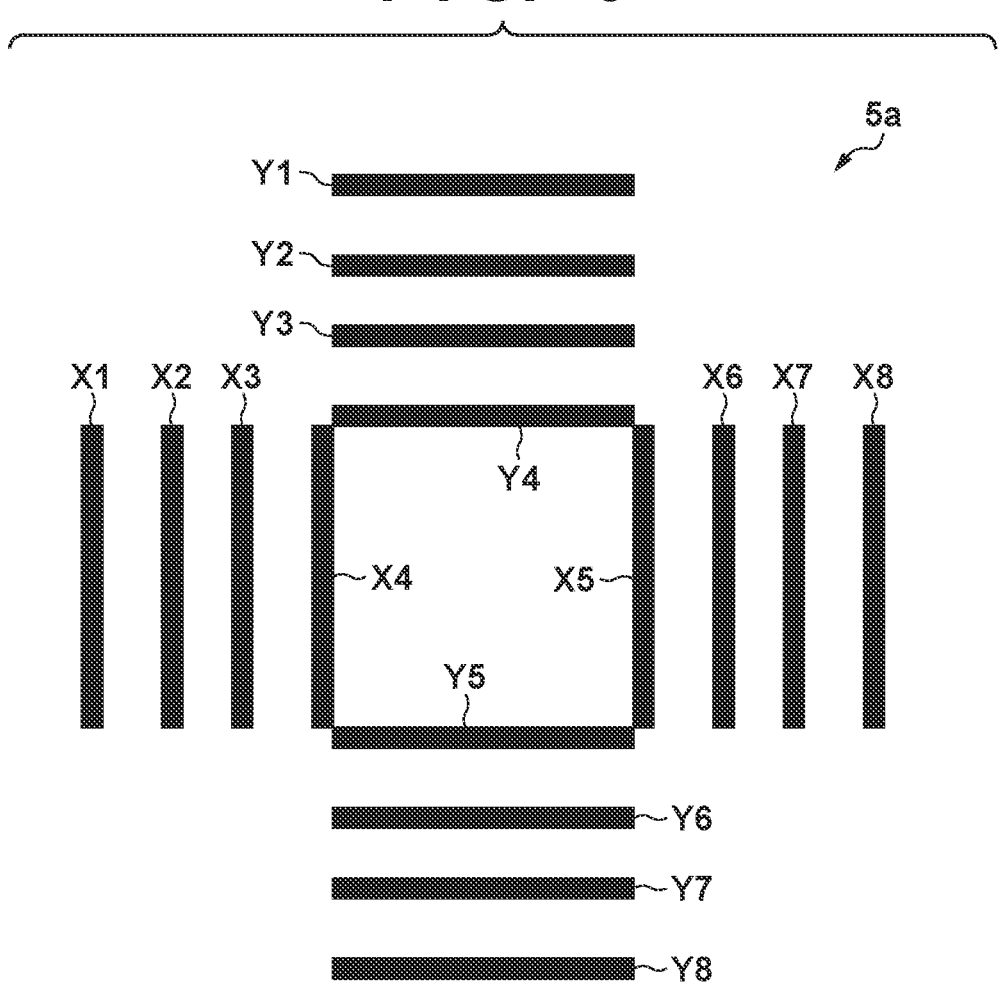
FIG. 6 is a view showing the arrangement of the mark on the substrate.

FIG. 5 is a flowchart showing a method of detecting the positions of the plurality of marks FXY1 to FXY4 formed on the substrate. An example will be described below in which the image capturing unit 12 captures the images of the marks FXY1 and FXY2 on the substrate at the low magnification, and captures the images of the marks FXY3 and FXY4 on the substrate at the high magnification.

In step S10, the controller 8 moves the substrate stage 6 to a target position for the image capturing unit 12 to capture the image of the mark FXY1 on the substrate. In step S11, the controller 8 captures the image of the mark FXY1 by the image capturing unit 12 at the low magnification and controls the detection unit 10 to detect the position of the mark FXY1 from the image thus obtained. In step S12, the controller 8 moves the substrate stage 6 to a target position for the image capturing unit 12 to capture the image of the mark FXY2 on the substrate. In step S13, the controller 8 captures the image of the mark FXY2 by the image capturing unit 12 at the low magnification and controls the detection unit 10 to detect the position of the mark FXY2 from the image thus obtained.

The steps (steps S11 and S13) of capturing the images of the marks 5a on the substrate by the image capturing unit 12 at the low magnification will now be described with reference to FIG. 7. FIG. 7 is a flowchart showing a process of capturing the images of the marks 5a on the substrate by the image capturing unit 12 at the low magnification. The processor 13 can control each step in the flowchart of FIG. 7.

In step S20, the processor 13 controls the image capturing unit 12 to capture the images of the marks 5a on the substrate at the low magnification. For example, the processor 13 determines an accumulation period (a preset accumulation period) obtained when the image capturing unit 12 has captured the image at the low magnification before as the accumulation period of charges in the image sensor 12f. Then, the processor 13 controls the image capturing unit 12 based on the determined accumulation period.

In step S21, the processor 13 judges whether the output value of the image sensor 12f falls within a target range. If the processor 13 judges that the output value of the image sensor 12f falls outside the target range, the process advances to step S22. If the processor 13 judges that the output value of the image sensor 12f falls within the target range, the process advances to step S23. In step S22, based on the output value of the image sensor 12f obtained in step S20, the processor 13 determines the accumulation period such that the output value of the image sensor 12f falls within the target range and controls the image capturing unit 12 to capture the images of the marks 5a on the substrate again using the determined accumulation period. The determined accumulation period can be used for subsequent image capturing at the low magnification. In step S23, the processor 13 determines the positions of the marks 5a on the substrate based on the images captured by the image sensor 12f at the low magnification.

Referring back to FIG. 5, in step S14, the controller 8 obtains the deviation amount of the substrate 5 based on the position of the mark FXY1 obtained in step S11 and the position of the mark FXY2 obtained in step S13. Then, in step S15, the controller 8 corrects, based on the deviation amount of the substrate 5 obtained in step S14, the target position of the substrate stage 6 when the images of the marks FXY3 and FXY4 on the substrate are captured at the high magnification. The deviation amount of the substrate 5 is, for example, a deviation amount obtained when the substrate 5 is mounted on the substrate stage 6, that is, the deviation amount of the substrate 5 with respect to the substrate stage 6 and can include a shift component (in the X direction and the Y direction), a rotation component, a magnification component, and the like. If the substrate 5 thus deviates from the substrate stage 6, the marks FXY3 and FXY4 on the substrate may not come into the field of view of the image capturing unit 12 even if the substrate stage 6 is moved in order to capture the images of the respective marks FXY3 and FXY4 at the high magnification. For this reason, the controller 8 obtains the deviation amount of the substrate 5 based on a result obtained by capturing the images of the marks FXY1 and FXY2 on the substrate at the low magnification.

In step S16, the controller 8 moves the substrate stage 6 to a target position for the image capturing unit 12 to capture the image of the mark FXY3 on the substrate. In step S17, the controller 8 captures the image of the mark FXY3 by the image capturing unit 12 at the high magnification and controls the detection unit 10 to detect the position of the mark FXY3 from the image thus obtained. In step S18, the controller 8 moves the substrate stage 6 to a target position for the image capturing unit 12 to capture the image of the mark FXY4 on the substrate. In step S19, the controller 8 captures the image of the mark FXY4 by the image capturing unit 12 at the high magnification and controls the detection unit 10 to detect the position of the mark FXY4 from the image thus obtained.

The steps (steps S17 and S19) of capturing the images of the marks 5a on the substrate by the image capturing unit 12 at the high magnification will now be described. Each mark 5a on the substrate can have a different state (such as the reflectance of light, the shape, or the like) among, for example, a plurality of substrates (lots). Accordingly, the output value of the image sensor 12f falls outside the target range depending on the state of each mark 5a, making it difficult to detect the position of the mark 5a accurately. Therefore, the detection unit 10 of the first embodiment performs, before the second image capturing for detecting the position of each mark 5a on the substrate, the first image capturing for determining the image capturing conditions of the second image capturing and determines the image capturing conditions of the second, image capturing based on the output of the image sensor 12f in the first image capturing. Then, the detection unit 10 performs, using the determined image capturing conditions, the second image capturing of each mark 5a on the substrate at a timing when the vibration of the substrate stage 6 falls within an allowable range (the second allowable range) and determines the position of the mark 5a based on the image obtained in the second image capturing.

In the detection unit 10, the intensity of light incident on the image sensor 12f can change in accordance with the vibration of the substrate stage 6. Therefore, the first image capturing may foe performed after the vibration of the substrate stage 6 is reduced to some extent so that the vibrations of the substrate stage 6 are set in states close to each other between the first image capturing and the second image capturing. For example, the first image capturing may be started at a timing when the vibration of the substrate stage 6 falls within the first allowable range wider than the second allowable range. However, if it is impossible to perform the first image capturing by the time when the vibration of the substrate stage 6 falls within the second allowable range and to determine the image capturing conditions of the second image capturing based on that result, the start of the second image capturing may be delayed, decreasing throughput. Therefore, the detection unit 10 may control the first image capturing such that the accumulation period of the charges in the image sensor 12f becomes shorter than that in the second image capturing.

FIG. 8 is a flowchart showing a process of capturing the images of the marks 5a on the substrate by the image capturing unit 12 at the high magnification. The processor 13 can control each step in the flowchart of FIG. 8.

In step S30, the processor 13 determines the image capturing conditions of the first image capturing. For example, the processor 13 sets the first target value of the output of the image sensor 12f in the first image capturing to a value smaller than the second target value of the output of the image sensor 12f in the second image capturing. Then, based on the intensity of light incident on the marks 5a on the substrate and the first target value, the processor 13 determines the first accumulation period in which the charges are accumulated in the image sensor 12f in the first image capturing as one of the image capturing conditions of the first image capturing. The intensity of the light incident on the marks 5a on the substrate can be obtained from, for example, power supplied to the light source 11 or the transmittance of the ND filter 12g.

It is possible, by controlling the first image capturing based on the first accumulation period thus determined, to make a time required for the first image capturing shorter than that for the second image capturing. For example, if the first target value is set to be half the light amount of the second target value, the first accumulation period can be about half the second accumulation period in which the charges are accumulated in the image sensor 12f in the second image capturing. As a result, the time required for the first image capturing can be shorter than that for the second image capturing. In the first embodiment, the intensities of the light incident on the marks 5a on the substrate can be set equal to each other between the first image capturing and the second image capturing. However, the present invention is not limited to this. For example, the power supplied to the light source 11 or the transmittance of the ND filter 12g may be changed such that the intensity of the light incident on the marks 5a on the substrate in the first image capturing becomes higher than that in the second image capturing.

In step S31, the processor 13 judges whether the vibration of the substrate stage 6 falls within the first allowable range. If the processor 13 judges that the vibration of the substrate stage 6 falls outside the first allowable range, step S31 is repeated. If the processor 13 judges that the vibration of the substrate stage 6 falls within the first allowable range, the process advances to step S32. Then, in step S32, the processor 13 controls the image capturing unit 12 to start the first image capturing, that is, start charge accumulation in the image sensor 12f.

In step S33, the processor 13 judges whether the vibration of the substrate stage 6 falls within the third allowable range. The third allowable range can be set such that a period is secured which is needed for the processor 13 to determine the image capturing conditions of the second image capturing based on the output of the image sensor 12f in the first image capturing. For example, the third allowable range can be set, based on a result obtained when the substrate stage 6 has been driven in the past, to be narrower than the first allowable range and wider than the second allowable range. If the processor 13 judges that the vibration of the substrate stage 6 falls outside the third allowable range, the process advances to step S34. If the processor 13 judges that the vibration of the substrate stage 6 falls within the third allowable range, the first image capturing is terminated and the process advances to step S35. In step S34, the processor 13 judges whether the first accumulation period has elapsed. If the processor 13 judges that the first accumulation period has elapsed, the first image capturing is terminated and the process advances to step S35. If the processor 13 judges that the first accumulation period has not elapsed, the process returns to step S33.

In step S35, the processor 13 determines the image capturing conditions of the second image capturing based on the output of the image sensor 12f in the first image capturing. For example, the processor 13 can obtain the ratio of the second target value and the output of the image sensor 12f in the first image capturing, and determine the image capturing conditions of the second image capturing based on the obtained ratio and the image capturing conditions of the first image capturing. The imaging conditions of the second image capturing can include at least one of, for example, the intensity of the light incident on the marks 5a on the substrate (the power supplied to the light source 11 or the transmittance of the ND filter 12g), the output gain of the image sensor 12f, and the accumulation period in which the charges are accumulated in the image sensor 12f.

In step S36, the processor 13 judges whether the vibration of the substrate stage 6 falls within the second allowable range. If the processor 13 judges that the vibration of the substrate stage 6 falls outside the second allowable range, step S36 is repeated. If the processor 13 judges that the vibration of the substrate stage 6 falls within the second allowable range, the process advances to step S3. In step S3, the processor 13 performs the second image capturing on the image capturing conditions determined in step S35 and determines the positions of the marks 5a on the substrate based on the images obtained by the image sensor 12f in the second image capturing.

As described above, the detection unit 10 of the first embodiment controls the first image capturing by setting the first target value of the output of the image sensor 12f in the first image capturing to a value smaller than the second target value of the output of the image sensor 12f in the second image capturing. Consequently, the time required for the first image capturing can be shortened. This makes it easier to determine the image capturing conditions of the second image capturing by the time when the vibration of the substrate stage 6 falls within the second allowable range. That is, it is possible to prevent a delay in the start of the second image capturing without the image capturing conditions of the second image capturing being determined by the time when the vibration of the substrate stage 6 falls within the second allowable range and a decrease in throughput.

Second Embodiment

In the first embodiment, the example has been described in which the first target value of the output of the image sensor 12f in the first image capturing is set to the value smaller than the second target value of the output of the image sensor 12f in the second image capturing. In the second embodiment, an example will be described in which the output gain of an image sensor 12f in the first image capturing is set to a value higher than that in the second image capturing. The second embodiment is different from the first embodiment in step S30 of a flowchart shown in FIG. 8. Therefore, step S30 will be described below and a description of other steps will be omitted.

In step S30 of FIG. 8, a processor 13 sets the output gain of the image sensor 12f in the first image capturing to the value higher than that in the second image capturing. At this time, the first target light amount in the first image capturing and the second target light amount in the second image capturing can be set to the same value. Then, the processor 13 determines the first accumulation period in which charges are accumulated in the image sensor 12f in the first image capturing as one of image capturing conditions of the first image capturing. It is possible, by controlling the first image capturing based on the first accumulation period thus obtained, to make a time required for the first image capturing shorter than that for the second image capturing. For example, if the output gain of the image sensor 12f in the first image capturing is set to be twice that in the second image capturing, the first accumulation period can be about half the second accumulation period in which the charges are accumulated in the image sensor 12f in the second image capturing. As a result, the time required for the first image capturing can be shorter than that for the second image capturing. In the second embodiment, the intensities of light incident on marks 5a on a substrate can be set equal to each other between the first image capturing and the second image capturing. However, the present invention is not limited to this. For example, power supplied to a light source 11 or the transmittance of an ND filter 12g may be changed such that the intensity of the light incident on the marks 5a on the substrate in the first image capturing becomes higher than that in the second image capturing.

Note that if the output gain of the image sensor 12f is made higher, noise is also amplified accordingly. This decreases the S/N ratio in an image obtained by the image sensor 12f. Therefore, the output gain of the image sensor 12f in the second image capturing may be set to a reference value (for example, ×1). Therefore, in step S30, the processor 13 may set the output gain of the image sensor 12f in the first image capturing to a value (for example, ×2) larger than the reference value and set the output gain of the image sensor 12f back to the reference value before the second image capturing is started in step S37.

As described above, in the second embodiment, the output gain of the image sensor 12f in the first image capturing is set to the value higher than that in the second image capturing, thereby controlling the first image capturing. Consequently, the time required for the first image capturing can be shortened as in the first embodiment. This makes it easier to determine image capturing conditions of the second image capturing by the time when the vibration of a substrate stage 6 falls within the second allowable range.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming a latent image pattern on a photoresist applied to a substrate using the above-described lithography apparatus (exposure apparatus) (step of exposing the substrate) and a step of processing (for example, developing) the substrate, on which the latent image pattern has been formed, in the preceding step. This manufacturing method further includes other known steps (oxidation, deposition, vapor deposition, doping, planarization, etching, resist removal, dicing, bonding, packaging, and the like). The method of manufacturing the article according to this embodiment is advantageous in at least one of the performance, the quality, the productivity, and the production cost of the article, as compared with a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-133920 filed on Jul. 2, 2015, which is hereby incorporated by reference herein in its entirety.

What is claimed is:

1. A detection apparatus which detects a position of a mark on a substrate, the apparatus comprising:
   a stage configured to be movable while holding the substrate;
   an image capturing unit having an image sensor configured to capture an image of the mark; and
   a processor configured to control a first image capturing and a second image capturing which cause the image capturing unit to capture images of the mark, the second image capturing being performed after the first image capturing, and determine the position of the mark based on an image obtained by the second image capturing,
   wherein the processor controls the first image capturing such that an output value of the image sensor becomes a first target value which is smaller than a second target value to be used in the second image capturing, and determines an image capturing condition for controlling the second image capturing such that an output value of the image sensor becomes the second target value, based on an image capturing condition used in the first image capturing, and
   wherein the processor starts the second image capturing at a timing when a vibration of the stage falls within an allowable range, and controls the first image capturing such that the image capturing condition for controlling the second image capturing is determined by the timing.

2. The apparatus according to claim 1, wherein
   the substrate is held by a movable stage, and
   the processor controls the image capturing unit such that the first image capturing is started at a timing when the stage moves to a target position and a vibration of the stage falls within a first allowable range, and then the second image capturing is started at a timing when the vibration of the stage falls within a second allowable range narrower than the first allowable range.

3. The apparatus according to claim 1, wherein the processor determines, as the image capturing condition in the first image capturing, a first accumulation period for accumulating charges in the image sensor in the first image capturing, based on an intensity of light incident on the mark and the target output value of the image sensor in the first image capturing, and controls the first image capturing based on the determined first accumulation period.

4. The apparatus according to claim 1, wherein the processor obtains a ratio of the output value of the image sensor obtained in the first image capturing and the second target value, and determines the image capturing condition of the second image capturing based on the obtained ratio and the image capturing condition used in the first image capturing.

5. The apparatus according to claim 1, wherein the processor controls the first image capturing by setting an output gain of the image sensor in the first image capturing to a value higher than that in the second image capturing.

6. The apparatus according to claim 1, wherein the image capturing condition of the second image capturing includes at least one of an intensity of light irradiating the mark, an output gain of the image sensor, and the accumulation period.

7. The apparatus according to claim 1, wherein the processor controls the second image capturing at a same magnification as a magnification at which the processor controls the first image capturing.

8. A lithography apparatus which forms a pattern on a substrate, the apparatus comprising:
   a stage configured to be movable while holding the substrate;
   a detection apparatus configured to detect a position of a mark on the substrate; and
   a controller configured to control, based on the position of the mark detected by the detection apparatus, a position of the stage when the pattern is formed on the substrate,
   wherein the detection apparatus includes:
      an image capturing unit having an image sensor configured to capture an image of the mark; and
      a processor configured to control a first image capturing and a second image capturing which cause the image capturing unit to capture images of the mark on the substrate, the second image capturing being performed after the first image capturing, and determine the position of the mark based on an image obtained by the second image capturing,
      wherein the processor controls the first image capturing such that an output value of the image sensor becomes a first target value which is smaller than a second target value to be used in the second image capturing, and determines an image capturing condition for controlling the second image capturing such that an output value of the image sensor becomes the second target value, based on an image capturing condition used in the first image capturing, and
      wherein the processor starts the second image capturing at timing when a vibration of the stage falls within an allowable range, and controls the first image capturing such that the image capturing condition for controlling the second image capturing is determined by the timing.

9. A method of manufacturing an article, the method comprising:
   forming a pattern on a substrate using a lithography apparatus; and
   processing the substrate, on which the pattern has been formed, to manufacture the article,
   wherein the lithography apparatus forms the pattern on the substrate, and includes:
      a stage configured to be movable while holding the substrate;
      a detection apparatus configured to detect a position of a mark on the substrate; and
      a controller configured to control, based on the position of the mark detected by the detection apparatus, a position of the stage when the pattern is formed on the substrate,
      wherein the detection apparatus includes:
         an image capturing unit having an image sensor configured to capture an image of the mark; and
         a processor configured to control a first image capturing and a second image capturing which cause the image capturing unit to capture images of the mark on the substrate, the second image capturing being performed after the first image capturing, and determine the position of the mark based on an image obtained by the second image capturing,
         wherein the processor controls the first image capturing such that an output value of the image sensor becomes a first target value which is smaller than a second target value to be used in the second image capturing, and determines an image capturing condition for controlling the second image capturing such that an output value of the image sensor becomes the second target value, based on an image capturing condition used in the first image capturing, and
         wherein the processor starts the second image capturing at timing when a vibration of the stage falls within an allowable range, and controls the first image capturing such that the image capturing condition for controlling the second image capturing is determined by the timing.

10. A detection method of detecting a position of a mark on a substrate held by a stage which is configured to be movable while holding the substrate, the method comprising:
   performing a first image capturing which causes an image sensor to capture an image of the mark;
   performing a second image capturing which causes the image sensor to capture an image of the mark, after the performing the first image capturing; and
   determining the position of the mark based on the image obtained in the second image capturing,
   wherein the first image capturing is controlled such that an output value of the image sensor becomes a first target value which is smaller than a second target value to be used in the second image capturing, and an image capturing condition for controlling the second image capturing is determined such that an output value of the image sensor becomes the second target value, based on an image capturing condition used in the first image capturing, and
   wherein the second image capturing is started at timing when a vibration of the stage falls within an allowable range, and the first image capturing is controlled such that the image capturing condition for controlling the second image capturing is determined by the timing.

11. A detection apparatus which detects a position of a mark on a substrate, the apparatus comprising:
   an image capturing unit having an image sensor configured to capture an image of the mark; and
   a processor configured to control a first image capturing and a second image capturing which cause the image capturing unit to capture images of the mark on the substrate, the second image capturing being performed after the first image capturing and determine the position of the mark based on an image obtained by the second image capturing,
   wherein the processor controls the first image capturing in a state of setting an output gain of the image sensor to a first target gain which is higher than a second target gain to be used in the second image capturing, and determines an image capturing condition for controlling the second image capturing in a state of setting an output gain of the image sensor to the second gain, based on an image capturing condition used in the first image capturing.

12. A detection apparatus which detects a position of a mark on a substrate, the apparatus comprising:
   an image capturing unit having an image sensor configured to capture an image of the mark; and
   a processor configured to control a first image capturing and a second image capturing which cause the image capturing unit to capture images of the mark, the second image capturing being performed after the first image capturing, and determine the position of the mark based on an image obtained by the second image capturing, wherein the processor controls the first image capturing such that an output value of the image sensor becomes a first target value which is smaller than a second target value to be used in the second image capturing, and determines an image capturing condition for controlling the second image capturing such that an output value of the image sensor becomes the second target value, based on an image capturing condition used in the first image capturing, and wherein the processor controls the second image capturing at a same magnification as a magnification at which the processor controls the first image capturing.

* * * * *